US011882652B2

(12) United States Patent
Ji et al.

(10) Patent No.: US 11,882,652 B2
(45) Date of Patent: Jan. 23, 2024

(54) PRINTED CIRCUIT BOARD

(71) Applicant: SAMSUNG ELECTRO-MECHANICS CO., LTD., Suwon-si (KR)

(72) Inventors: Yun Je Ji, Suwon-si (KR); Seung Eun Lee, Suwon-si (KR); Yong Hoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/459,212

(22) Filed: Aug. 27, 2021

(65) Prior Publication Data

US 2022/0361324 A1 Nov. 10, 2022

(30) Foreign Application Priority Data

May 6, 2021 (KR) .................. 10-2021-0058672

(51) Int. Cl.
*H05K 1/02* (2006.01)
*H05K 1/18* (2006.01)

(52) U.S. Cl.
CPC ........... *H05K 1/0298* (2013.01); *H05K 1/181* (2013.01); *H05K 2201/10287* (2013.01); *H05K 2201/2009* (2013.01)

(58) Field of Classification Search
CPC ............... H05K 1/0298; H05K 1/181; H05K 2201/10287; H05K 2201/2009; H05K 2201/09845; H05K 2201/09509; H05K 2201/09563; H05K 2201/096; H05K 2201/09854
See application file for complete search history.

(56) References Cited

U.S. PATENT DOCUMENTS

| | | | | |
|---|---|---|---|---|
| 5,227,013 A | * | 7/1993 | Kumar | H01L 21/486 219/121.85 |
| 9,997,442 B1 | * | 6/2018 | Lin | H01L 23/13 |
| 2010/0065959 A1 | | 3/2010 | Horiuchi et al. | |
| 2010/0319974 A1 | * | 12/2010 | Ishizuka | H05K 1/0271 156/60 |
| 2012/0187557 A1 | | 7/2012 | Kyozuka et al. | |
| 2014/0021625 A1 | * | 1/2014 | Nakamura | H01L 25/105 257/773 |

(Continued)

FOREIGN PATENT DOCUMENTS

| | | | |
|---|---|---|---|
| JP | 5281346 B2 | | 5/2013 |
| JP | 5715835 B2 | | 3/2015 |
| KR | 10-2019-0053007 A | | 5/2019 |

OTHER PUBLICATIONS

NGK Spark Plug Co Ltd, JP6037514, Published Dec. 7, 2016 (Year: 2016).*

*Primary Examiner* — Steven T Sawyer
(74) *Attorney, Agent, or Firm* — Morgan, Lewis & Bockius LLP

(57) ABSTRACT

The present disclosure relates to a printed circuit board. The printed circuit board includes: a plurality of insulating layers; a plurality of circuit layers disposed on at least one of an interior and an exterior of the plurality of insulating layers; and a reinforcing layer disposed on one surface of the plurality of insulating layers, and having a first opening having a first width and a second opening having a second width, different from the first width.

17 Claims, 10 Drawing Sheets

(56) References Cited

U.S. PATENT DOCUMENTS

| | | | |
|---|---|---|---|
| 2015/0131255 A1* | 5/2015 | Do | H01L 24/49 361/783 |
| 2019/0096814 A1* | 3/2019 | Wang | H01L 23/3107 |
| 2019/0380203 A1* | 12/2019 | Ota | H05K 1/0366 |
| 2020/0144234 A1* | 5/2020 | Jeon | H01L 23/49838 |
| 2022/0377902 A1* | 11/2022 | Shin | H05K 1/185 |

* cited by examiner

PRINTED CIRCUIT BOARD

CROSS-REFERENCE TO RELATED APPLICATION(S)

This application claims benefit of priority to Korean Patent Application No. 10-2021-0058672 filed on May 6, 2021 in the Korean Intellectual Property Office, the disclosure of which is incorporated herein by reference in its entirety.

TECHNICAL FIELD

The present disclosure relates to a printed circuit board, particularly a printed circuit board including a reinforcing layer.

BACKGROUND

In the case of a substrate application field requiring an ultra-thin substrate, such as a memory package substrate, there is a limit to thinning due to a problem of rigidity for driving the substrate. To compensate for this, a printed circuit board manufactured by an embedded trace substrate (ETS) method in which a circuit layer is embedded in a surface on which electronic components are mounted while securing stiffness required for driving a board by manufacturing a reinforcing layer performing a function of reinforcing the stiffness.

SUMMARY

An aspect of the present disclosure is to provide a printed circuit board with reinforced rigidity.

Another aspect of the present disclosure is to provide a printed circuit board including a reinforcing layer in which a plurality of openings having different widths are formed.

Another aspect of the present disclosure is to provide a printed circuit board on which a plurality of reinforcing layers are stacked.

According to an aspect of the present disclosure, a printed circuit board may include: a plurality of insulating layers; a plurality of circuit layers disposed on at least one of an interior and an exterior of the plurality of insulating layers; and a reinforcing layer disposed on one surface of the plurality of insulating layers, and having a first opening having a first width and a second opening having a second width, different from the first width.

According to an aspect of the present disclosure, a printed circuit board may include: a plurality of insulating layers; a plurality circuit layers disposed on at least one of an interior and an exterior of the plurality of insulating layers; a first reinforcing layer disposed on one surface of the plurality of insulating layers; a second reinforcing layer disposed on a surface, opposite to the surface in which the first reinforcing layer is in contact with the plurality of insulating layers; a first opening having a first width and passing through at least a portion of each of the first and second reinforcing layers; and a second opening having a second width, different from the first width, and passing through at least a portion of the first reinforcing layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
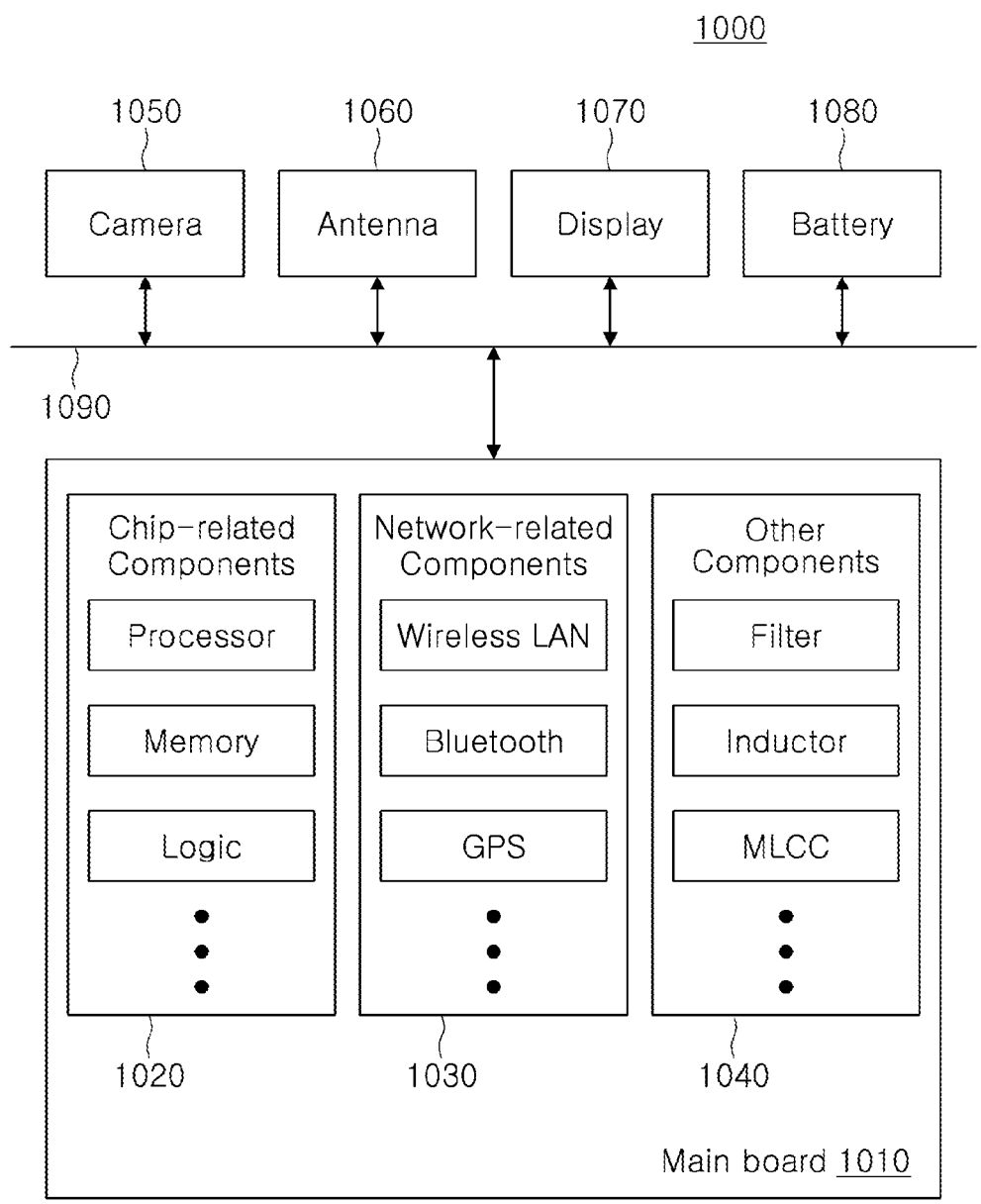
FIG. 1 is a block diagram schematically illustrating an example of an electronic device system.

Hereinafter, the present disclosure will be described with reference to the accompanying drawings. Shapes and dimensions of the elements in the drawings may be exaggerated or reduced for greater clarity of description.

FIG. 1 is a block diagram schematically illustrating an example of an electronic device system.

Referring to FIG. 1, an electronic device 1000 may accommodate a main board 1010. The main board 1010 may include chip-related components 1020, network-related components 1030, other components 1040, or the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip-related components 1020 are not limited thereto, and may include other types of chip-related components. In addition, the chip-related components 1020 may be combined with each other.

The network-related components 1030 may include protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 includes other components that may or may not be physically or electrically connected to the main board 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
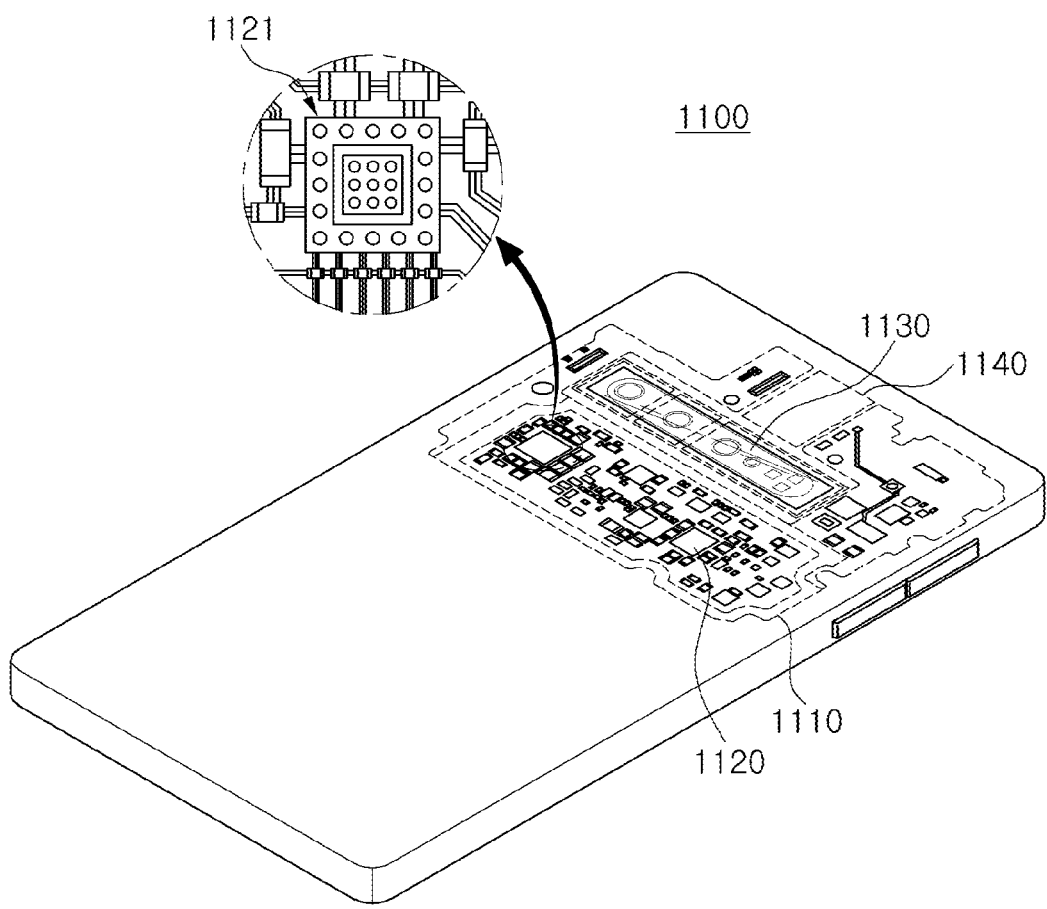
FIG. 2 is a perspective view schematically illustrating an example of an electronic device.

FIG. 2 is a perspective view schematically illustrating an example of an electronic device.

Referring to FIG. 2, the electronic device may be, for example, a smartphone 1100. A motherboard 1110 is accommodated in the smartphone 1100, and various electronic components 1120 may be physically or electrically connected to the motherboard 1110. In addition, a camera module 1130 and/or a speaker 1140, and the like may be accommodated in the smartphone 1100. Some of the electronic components 1120 may be the chip related components described above, for example, an electronic component-embedded substrate, but are not limited thereto. The electronic component-embedded substrate 1121 may have a form in which an electronic component is embedded in a multilayer electronic component-embedded substrate, but the configuration type is not limited thereto. On the other hand, the electronic device is not necessarily limited to the smartphone 1100, and may be other electronic devices as described above.

Figure 3:
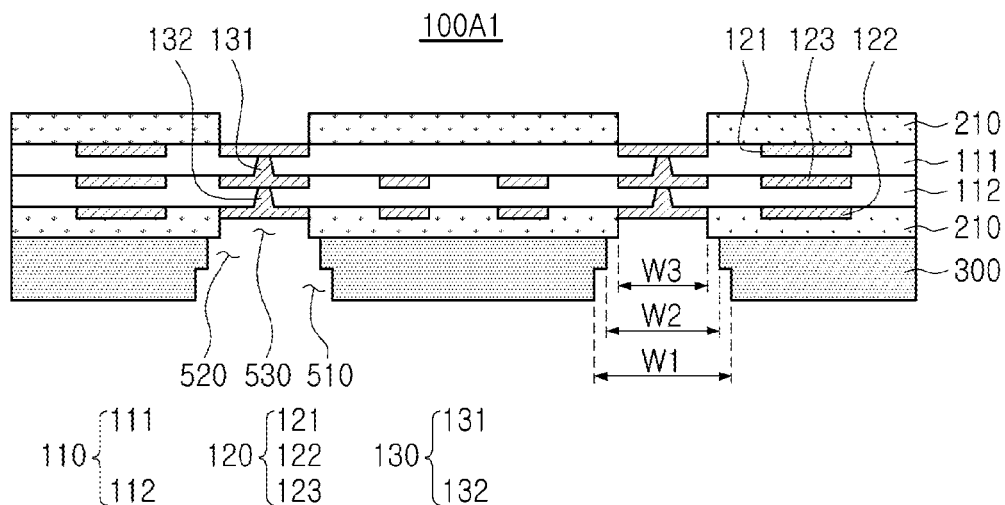
FIG. 3 is a cross-sectional view schematically illustrating an example of a printed circuit board.

FIG. 3 is a cross-sectional view illustrating an example of a printed circuit board.

Referring to FIG. 3, a printed circuit board 100A1 according to an example includes: a plurality of insulating layers 110, a plurality of circuit layers 120 disposed on at least one of an interior and an exterior of the plurality of insulating layers 110, a plurality of via layers 130 penetrating through at least a portion of the plurality of insulating layers 110 and connecting a space between the plurality of circuit layers 120, a first passivation layer 210 disposed on one surface and the other surface of the plurality of insulating layers 110, and a reinforcing layer 300 disposed on one surface of the plurality of insulating layers 110, and having a first opening 510 having a first width W1 and a second opening 520 having a second width W2, different from the first width W1.

For example, in the printed circuit board 100A1 according to an example, as in a process to be described later, the reinforcing layer 300 is stacked on one surface of the plurality of insulating layers 110, and stiffness of the printed circuit board 100A1 may be reinforced, which is advantageous in controlling warpage of the printed circuit board 100A1.

Meanwhile, the printed circuit board 100A1 according to an example may be manufactured using a detach carrier film (DCF), which will be described later. Accordingly, a first circuit layer 121 among the plurality of circuit layers 120 may be embedded in the other surface of the printed circuit board 100A1. Accordingly, it is possible to implement the first circuit layer 121 as a finer circuit layer. Therefore, a pitch and a line width between circuit patterns of the first circuit layer 121 can be made smaller than that of a conventional circuit layer, where the pitch may refer to an average value of the shortest distance connecting centers of adjacent circuit patterns to each other, and the line width may refer to an average value of horizontal widths of the circuit patterns.

Meanwhile, openings having different widths may be formed in the reinforcing layer 300 of the printed circuit board 100A1 according to an example. For example, a first opening 510 having a first width W1 and a second opening 520 having a second width W2 may be formed, and since the widths of the first and second openings 510 and 520 are different, an inner wall of the reinforcing layer 300 may have a step. Since the widths of the first and second openings 510 and 520 are different from each other, when an electrical connection metal to be described later is disposed in the first and second openings 510 and 520, reliability and adhesion may be further increased.

Hereinafter, components of the printed circuit board 100A1 according to an example will be described in more detail with reference to the drawings.

The plurality of insulating layers 110 include a first insulating layer 111 and a second insulating layer 112, which are sequentially stacked. An insulating material may be used as a material of the plurality of insulating layers 110, and a thermosetting resin such as an epoxy resin or a thermoplastic resin such as polyimide may be used as the insulating material. In addition, those containing inorganic fillers such as silica and reinforcing materials such as glass fibers may be used in these resins. For example, a prepreg may be used, but is not limited thereto, and a material that does not contain a reinforcing material such as glass fiber, for example, an ABF (Ajinomoto Build-up Film), or the like, may be used. The ABF may be provided in a form of a resin coated copper (RCC), but is not limited thereto. If necessary, a photosensitive material such as PID (Photo Image-able Dielectric) may be used. In the case of FIG. 3, only the first and second insulating layers 111 and 112 are illustrated, but the plurality of insulating layers 110 may include a larger number of insulating layers according to necessity and design.

The plurality of circuit layers 120 may be disposed on at least one of an interior and an exterior of the plurality of insulating layers 110. The plurality of circuit layers 120 may include a second circuit layer 122 protruding from one surface of the plurality of insulating layers 110, a first circuit layer 121 embedded from the other surface of the plurality of insulating layers 110, and an inner circuit layer 123 disposed inside the plurality of insulating layers 110. Taking the printed circuit board 100A1 of FIG. 3 as an example, the plurality of circuit layers 120 may include a first circuit layer 121 embedded in an upper surface of the first insulating layer 111, and an inner circuit layer 123 embedded in a lower surface of the first insulating layer 111, and a second circuit layer 122 disposed to protrude on a lower surface of the second insulating layer 112. As a material of the plurality of circuit layers 120, a metal material maybe used. As the metal material, copper (Cu), aluminum (Al), silver (Ag), tin (Sn), gold (Au), nickel (Ni), lead (Pb), titanium (Ti), or alloys thereof may be used. The plurality of circuit layers 120 may perform various functions according to designs. For example, the plurality of circuit layers 120 may include a ground pattern, a power pattern, a signal pattern, and the like. Each of these patterns may have a line, plane, or pad shape. The plurality of circuit layers 120 may be formed by a plating process such as an additive process (AP), a semi AP (SAP), a modified SAP (MSAP), tenting (TT), and the like, and as a result, may include a seed layer, an electroless plating layer, and an electrolytic plating layer formed based on the seed layer. When a plurality of the plurality of insulating layers 110 are provided in a RCC form, the plurality of circuit layers 120 may further include a metal foil such as a copper foil, and if necessary, a primer resin may be present on a surface of the metal foil. In the case of FIG. 3, only the first and second circuit layers 121 and 122 and the inner circuit layer 123 are illustrated, but the plurality of circuit layers 120 may include a larger number of circuit layers according to necessity and design. In this case, the inner circuit layer 123 may include a larger number of circuit layers.

The plurality of via layers 130 may include a first via layer 131 penetrating through the first insulating layers 111 and electrically connecting the first and second circuit layers 121 and 122, and a second via layer 131 penetrating through the second insulating layers 112 and electrically connecting the inner circuit layer 123 and the second circuit layer 122. As a material of the plurality of via layers 130, a metal material may be used. As the metal material, copper (Cu), aluminum (Al), silver (Ag), tin (Sn), gold (Au), nickel (Ni), lead (Pb), titanium (Ti), or alloys thereof may be used. The plurality of via layers 130 may include a signal via, a ground via, a power via, and the like according to designs. Respective vias of a plurality of via layers 130 may be formed by being completely filled with a via hole with a metal material, or may be formed along a wall surface of the via hole. The plurality of via layers 130 may also be formed by a plating process such as an additive process (AP), a semi AP (SAP), a modified SAP (MSAP), tenting (TT), and the like, and as a result, may include a seed layer, an electroless plating layer, and an electrolytic plating layer formed based on the seed layer. Respective vias of the plurality of via layers 130 may have a tapered shape in which a width of one surface is greater than a width of the other surface. Specifically, respective vias of the plurality of via layers 130 may have a tapered shape in which a width thereof becomes narrower in a direction from one surface to the other surface of the plurality of insulating layers 110. In the case of FIG. 3, only the first and second via layers 131 and 132 are illustrated, but the plurality of via layers 130 may include a larger number of via layers according to necessity of design.

The first passivation layer 210 may protect an internal configuration from external physical and chemical damage, or the like. The first passivation layer 210 may be disposed on one surface and the other surface of the plurality of insulating layers 110, and may have a plurality of third openings 530, respectively. The third opening 530 may be formed in a position in which at least a portion thereof overlap first and second openings 510 and 520 of the reinforcing layer 300 to be described later in a stacking direction, and may expose an outermost circuit layer externally. For example, the third opening 530 of the first passivation layer 210 disposed on one surface of the plurality of insulating layers 110 may expose at least a portion of the second circuit layer externally, and the third opening 530 of the first passivation layer 210 disposed on the other surface of the plurality of insulating layers 110 may expose at least a portion of the first circuit layer 121 externally.

A width of the third opening 530 of the first passivation layer 210 may be greater or smaller than line widths of first and second circuit layers 121 and 122 in which at least a portion thereof are exposed to the third opening 530. Referring to the embodiment of FIG. 3, a structure in which the width of the third opening 530 is the same as the line widths of the first and second circuit layers 121 and 122 are disclosed, but the width of the third opening 530 may be smaller the line width of each of the first and second circuit layers 121 and 122, or may be greater than the line width of each of the first and second circuit layers 121 and 122.

As a material of the first passivation layer 210, an insulating material may be used. In this case, as an insulating material, a thermosetting resin such as an epoxy resin, a thermoplastic resin such as a polyimide resin may be used, or a material in which these resins are mixed with inorganic fillers, for example, an ABF may be used, but is not limited thereto. A photosensitive insulating material such as a photoimageable dielectric (PID) may be used.

Although not shown, a surface treatment layer may be disposed in a region exposed by the third opening 530 of the first passivation layer 210 among the first and second circuit layers 121 and 122. Through the surface treatment layer, oxidation of the first and second circuit layers 121 and 122 exposed by the third opening 530 may be prevented, and reliability with an electrical connection metal to be disposed later may be secured. As the surface treatment layer, a nickel (Ni) plating layer, a gold (Au) plating layer, or an organic solderability preservative (OSP) surface treatment layer may be used, but is not limited thereto.

The reinforcing layer 300 may perform a function of reinforcing the rigidity of the printed circuit board 100A1. The reinforcing layer 300 may be disposed on one surface of the plurality of insulating layers 110, for example, may be disposed on the first passivation layer 210 disposed on one surface of the plurality of insulating layers 110. The reinforcing layer 300 needs to have a certain thickness in order to secure the rigidity of the printed circuit board 100A1. Accordingly, the reinforcing layer 300 may be thicker than each of the first and second insulating layers 111 and 112 among the plurality of insulating layers 110. In addition, the reinforcing layer 300 may be thicker than the first passivation layer 210.

First and second openings 510 and 520 may be formed in the reinforcing layer 300. The first and second openings 510 and 520 may be formed by a blast process to be described later, and may be formed to have first and second widths W1 and W2, respectively. The first width W1 of the first opening 510 may mean a width of the first opening 510 in a cross-section, perpendicular to a stacking direction. In the present disclosure, the width may mean a diameter of a circle when the cross-section thereof is circular, may mean a length of one corner when the cross-section thereof is square, and may mean an average value of the lengths of each corner when the cross-section thereof is rectangular.

The first width W1 may be greater than the second width W2. In addition, as compared to the third width W3 of the third opening 530 formed in the above-described first passivation layer 210, the second width W2 may be greater than the third width W3. As a result, the first width W1 may be greater than the second width W2, and the second width W2 may be greater than the third width W3. As the second width W2 is greater than the third width W3, when an electrical connection metal is disposed in the third opening 530 later, the reliability and adhesion of the electrical connection metal can be improved, and a peeling phenomenon can be prevented. In addition, since the first width W1 is larger than the second width W2, similarly thereto, the reliability and adhesion of the electrically connecting metal can be improved, and the peeling phenomenon can be prevented.

The first and second openings 510 and 520 may be formed to be connected to each other, and at least some regions thereof may overlap each other in a stacking direction. In addition, since the first width W1 may be greater than the second width W2, referring to the embodiment shown in FIG. 3, when viewed from the stacking direction of the printed circuit board 100A1, the second opening 520 may be formed in the first opening 510. Accordingly, an inner wall of the reinforcing layer 300 may have a step due to the first and second openings 510 and 520 having different first and second widths W1 and W2. As the inner wall of the reinforcing layer 300 has a step, the adhesiveness of the electrical connection metal disposed in the first and second openings 510 and 520 may later be further improved, and reliability may also be improved.

Meanwhile, the third opening 530 may also be formed to be connected to the second opening 520, and at least some regions thereof may overlap in the stacking direction. Referring to the embodiment shown in FIG. 3, in the stacking direction, the first opening 510 may include both the second and third openings 520 and 530, and the first to third openings 510, 520, and 530 may be connected to each other and integrally formed.

An insulating material may be used as a material of the reinforcing layer 300, and a thermosetting resin such as an epoxy resin or a thermoplastic resin such as polyimide may be used as the insulating material. The material of the reinforcing layer 300 may include an insulating material, and a material not including a reinforcing material such as glass fiber, or the like, for example, an ABF, or the like may also be used. The ABF may be provided in a form of an RCC, but is not limited thereto. As necessary, a photosensitive insulating material such as PID may be used. In addition, in the case of the reinforcing layer 300, in order to secure the rigidity of the printed circuit board 100A1, the reinforcing layer 300 may include a material having greater rigidity than the plurality of insulating layers 110 and the first passivation layer 210, and accordingly, the reinforcing layer 300 may have relatively greater rigidity than the plurality of insulating layers 110 and the first passivation layer 210.

Figure 4:
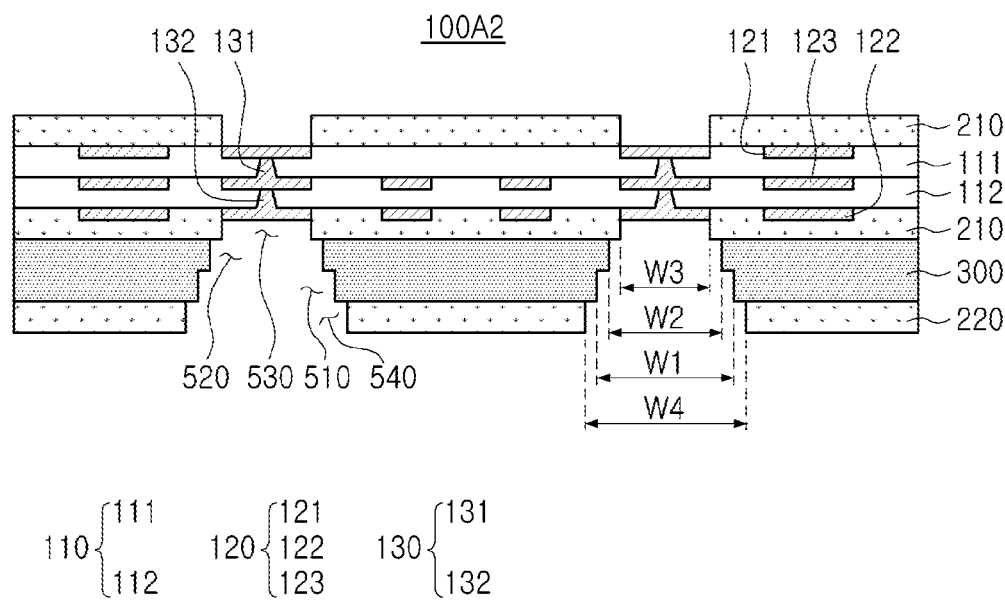
FIG. 4 is a cross-sectional view schematically illustrating a modified example of the printed circuit board of FIG. 3.

FIG. 4 is a cross-sectional view schematically illustrating a modified example of the printed circuit board of FIG. 3.

Referring to FIG. 4, in a printed circuit board 100A2 according to the modified example, as compared to the printed circuit board 100A1 according to the above-described example, a second passivation layer 220 may be further disposed on the reinforcing layer 300. In this case, a plurality of fourth openings 540 having a fourth width W4 may be formed in the second passivation layer 220.

Specifically, a plurality of fourth openings 540 having a fourth width W4 may be formed in the second passivation layer 220, and at least a portion of the fourth openings 540 may be formed to overlap each of the first to third openings 510, 520, and 530 in a stacking direction. Referring to the embodiment shown in FIG. 4, the fourth opening 540 may be connected to the first opening 510, and include all of the first to third openings 510, 520, and 530 when viewed from the stacking direction. That is, the first to fourth openings 510, 520, 530, and 540 may be integrally connected to each other.

As a material of the second passivation layer 220, an insulating material used as the material of the first passivation layer 210 may be used, but the materials of the first and second passivation layers 210 and 220 do not have to be the same.

As the second passivation layer 220 is disposed, a structure in which the first passivation layer 210, the reinforcing layer 300, and the second reinforcing layer 220 are sequentially stacked on one side of the plurality of insulating layers 110 of the printed circuit board 100A2, is shown. Therethrough, rigidity may further reinforced on a side in which an electrical connection metal is disposed, which is an opposite side of the side on which the electronic component to be described later is disposed among outer surfaces of the printed circuit board 100A2. Through this structure, in the present disclosure, structurally thinning is possible, as compared to a structure in which in which a reinforcing layer is disposed on a side on which an electronic component is disposed. This is because the reinforcing layer 300 and the additional passivation layer 220 may be disposed in a gap between substrates originally used for the electrical connection metal to be disposed.

Regarding the description of other overlapping configurations, the description of the printed circuit board 100A1 according to an example may be equally applicable, and thus will be omitted.

Figure 5:
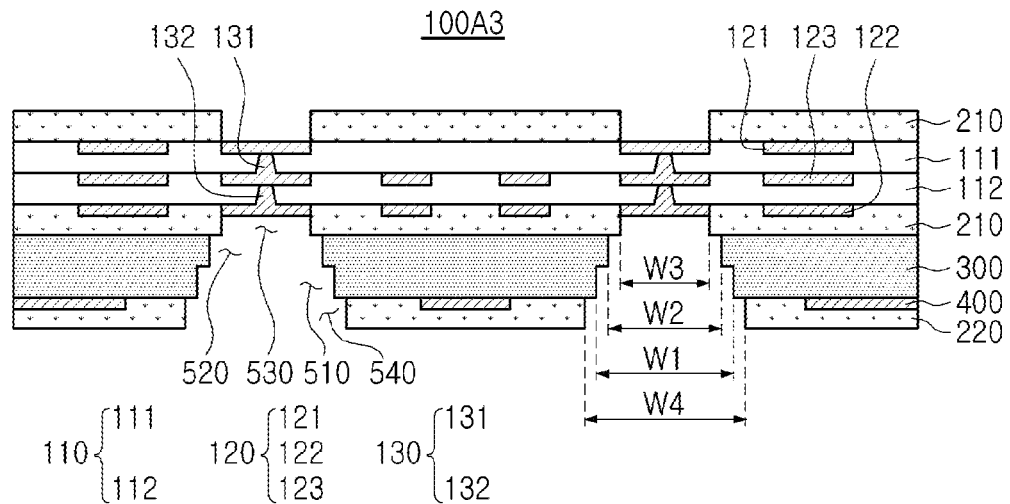
FIG. 5 is a cross-sectional view schematically illustrating another modified example of the printed circuit board of FIG. 3.

FIG. 5 is a cross-sectional view schematically illustrating another modified example of the printed circuit board of FIG. 3.

Referring to FIG. 5, in a printed circuit board 100A3 according to another modified example, as compared to the printed circuit board 100A2 according to the above-described modified example, a metal layer 400 may be further disposed on the reinforcing layer 300. In this case, the metal layer 400 may be covered by the second passivation layer 220.

Specifically, the metal layer 400 may be disposed on a surface, opposite to the surface on which the reinforcing layer 300 is in contact with the first passivation layer 210, and may be covered by the second passivation layer 220. The metal layer 400 may be patterned to expose a fourth opening 540 to form the fourth opening 540.

The metal layer 400 may be disposed on a reinforcing layer 300 to further increase rigidity of the printed circuit board 100A3, thereby effectively controlling warpage. When the reinforcing layer 300 is provided in a form of an RCC, the metal layer 400 may be patterned by etching a copper foil layer included in the RCC, but is not limited thereto.

A metal material may be used as the material of the metal layer 400, and as the metal material, copper (Cu), aluminum (Al), silver (Ag), tin (Sn), gold (Au), nickel (Ni), and lead (Pb), titanium (Ti), or an alloy thereof may be used.

In addition, the metal layer 400 may be relatively disposed on an outside of the printed circuit board 100A3 and connected to a ground of the printed circuit board 100A3 to perform an EMI (Electro Magnetic Interference) shielding function.

Regarding the description of other overlapping components, the description of the printed circuit board 100A2 according to the modified example may be equally applied, and thus the description thereof will be omitted.

Figure 6:
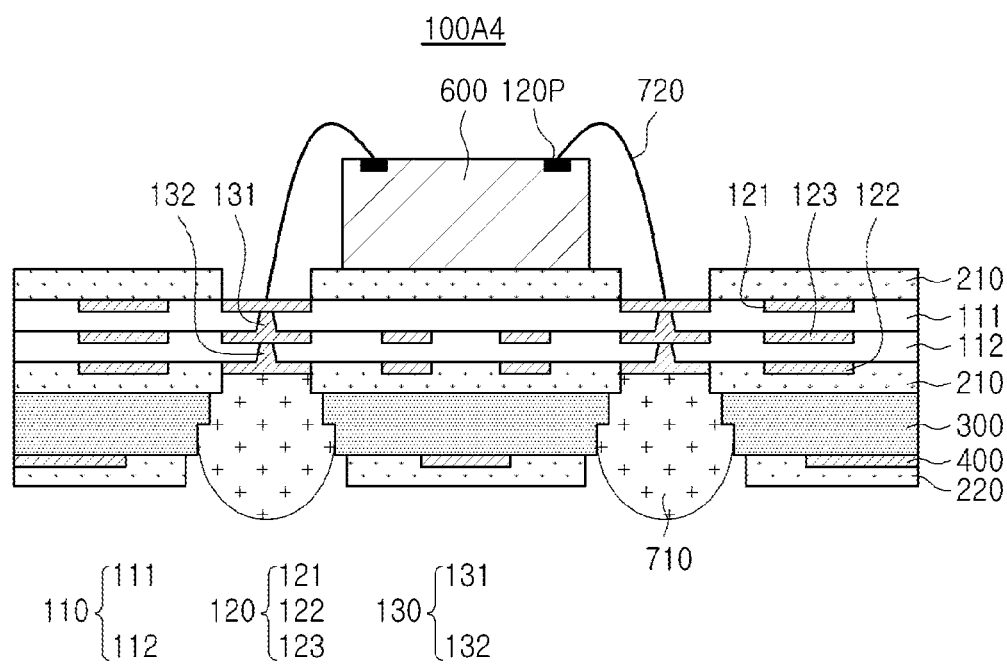
FIG. 6 is a cross-sectional view schematically illustrating another modified example of the printed circuit board of FIG. 3.

FIG. 6 is a cross-sectional view schematically illustrating another modified example of the printed circuit board of FIG. 3.

Referring to FIG. 6, in a printed circuit board 100A4 according to another modified example, as compared to the printed circuit board 100A3 according to the other modified example described above, an electronic component 600, and first and second electrical connection metals 710 and 720 may be further disposed.

Specifically, the electronic component 600 may be disposed on the other side of the printed circuit board 100A4. Referring to the embodiment of FIG. 6, the electronic component 600 may be disposed on the other surface of the plurality of insulating layers 110, specifically may be disposed on the first passivation layer 210 disposed on the other surface of the plurality of insulating layers 110. In this case, an adhesive layer such as a die attach film (DAF) may be disposed between the electronic component 600 and the first passivation layer 210 to maintain adhesive force, but is not limited thereto, and may also be disposed to be in contact the first passivation layer 210 without a separate adhesive layer.

The electronic component 600 may be an integrated circuit (IC) die in which hundreds to millions of elements are integrated in a single chip. For example, the electronic component 600 may be a processor chip such as a central processor (e.g., CPU), a graphic processor (e.g., GPU), a field programmable gate array (FPGA), a digital signal processor, an encryption processor, a microprocessor, a microcontroller, or the like, specifically, an application processor (AP), but is not limited thereto, and may be a memory such as a volatile memory (e.g. , DRAM), a non-volatile memory (e.g. , ROM), a flash memory, or the like, an analog-digital converter, or a logic such as an application-specific IC (ASIC), or the like. If necessary, the electronic component 600 may be a chip-type passive component, for example, a chip-type inductor, a chip-type capacitor, or the like. The electronic component 600 may be disposed such that a surface on which a connection pad 120P is disposed faces upwardly, and a side opposite the side thereof faces downwardly. The connection pad 120P of the electronic component 600 may include a metal material such as copper (Cu) or aluminum (Al), and may be connected to the first circuit layer 121.

A first electrical connection metal may be disposed on one side of the printed circuit board 100A4. Specifically, the first electrical connection metal may be disposed on the first passivation layer 210 disposed on one surface of the plurality of insulating layers 110, and may be disposed to fill at least a portion of each of the first to fourth openings 510, 520, 530, and 540 described above. The first electrical connection metal 710 may be electrically connected to the exposed second circuit layer 122. The first electrical connection metal 710 may physically and/or electrically connect a substrate having a printed circuit board 100A4 to an external entity. For example, the printed circuit board 100A4 may be mounted on a mainboard of an electronic device, other BGA substrate, or the like therethrough. The first electrical connection metal 710 may physically and/or electrically connect the printed circuit board 100A4 to a component surface-mounted thereon, and may connect it to other substrate such as a mainboard, or the like on which the printed circuit board 100A4 are mounted. The first electrical connection metal 710 may be formed of tin (Sn), or an alloy containing tin (Sn), for example, a solder, but this is not limited thereto. The first electrical connection metal 710 may be a land, a ball, a pin, or the like.

As the first electrical connection metal 710 is disposed in the first to fourth openings 510, 520, 530, and 540 having different widths from each other, bonding force and reliability may be further improved. In other words, since an inner wall of each of the first passivation layer 210, the reinforcing layer 300, and the second passivation layer 220 has a different width, the inner wall forms a step. An opening having a step in the inner wall may increase the bonding force between the electrical connection metal and the insulating layer by an anchor effect, or the like, as compared to a normal opening having a smooth inner wall.

Therefore, the first to fourth openings 510, 520, 530, and 540 connected to each other are integrally formed may be formed on one side of the printed circuit board 100A4, and the first electrical connection metal 710 may be disposed in the first to fourth openings 510, 520, 530, and 540, such that the bonding force and reliability between the inner wall and the first electrical connection metal 710 may be improved to effectively improve a phenomenon in which the first electrical connection metal 710 is peeled off.

The second electrical connection metal 720 may electrically connect the electronic component 600 to the first circuit layer 121. The second electrical connection metal 720 may be formed of tin (Sn), or an alloy containing tin (Sn), for example, a solder, similar to that of the first electrical connection metal 710, but this is not limited thereto. The second electrical connection metal 720 may be a land, a ball, a pin, or the like, and may be a metal wire referring to the embodiment shown in FIG. 6. Accordingly, the electronic component 600 and the first circuit layer 121 may be connected by wire bonding.

With respect to the description of other overlapping components, the description of the printed circuit board 100A3 according to the above-described other modified example may be equally applied, and thus the description thereof will be omitted.

Figure 7:
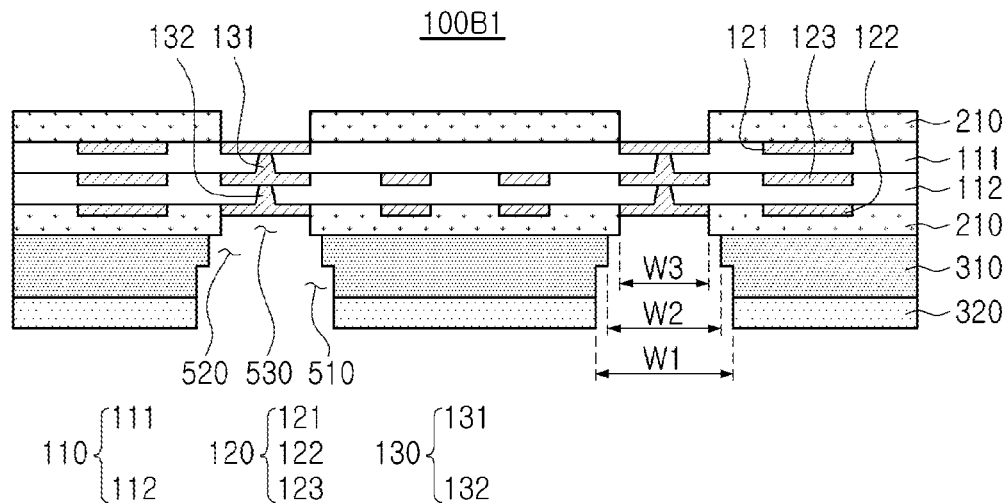
FIG. 7 is a cross-sectional view schematically illustrating another example of a printed circuit board.

FIG. 7 is a cross-sectional view schematically illustrating another example of a printed circuit board.

Referring to FIG. 7, in a printed circuit board 100B1 according to another example, as compared to the printed circuit board 100A1 according to the above-described example, a reinforcing layer 300 may be composed of a plurality of layers.

Specifically, referring to an embodiment of FIG. 7, the reinforcing layer may include a first reinforcing layer 310 and a second reinforcing layer 320 disposed on the first reinforcing layer 310. As in the present embodiment, as the reinforcing layer has a plurality of layers, it is possible to more effectively secure rigidity of the printed circuit board 100B1.

With respect to the first reinforcing layer 310, the description of the reinforcing layer 300 in the printed circuit board 100A1 according to the above-described example may be equally applied.

According to the present embodiment, a first opening 510 of the first reinforcing layer 310 may also be formed in the second reinforcing layer 320. That is, the first opening 510 may be collectively formed in the first and second reinforcing layers 310 and 320 by a blast process to be described later. Accordingly, the first openings 510 formed in each of the first reinforcing layer 310 and the second reinforcing layer 320 may be connected and have substantially the same width. In the present disclosure, substantially the same refers to a range including not only the physically/numerically completely identical case, but also an error that may occur during the process.

The second reinforcing layer 320 may be stacked on the first reinforcing layer 310, and a material of the second reinforcing layer 320 may include the same material as the material used as the material of the first reinforcing layer 310 described above. However, it is not necessary to include the same material as the first reinforcing layer 310.

Regarding the description of other overlapping components, the description of the printed circuit board 100A1 according to the above-described example may be equally applied, and thus will the description thereof be omitted.

Figure 8:
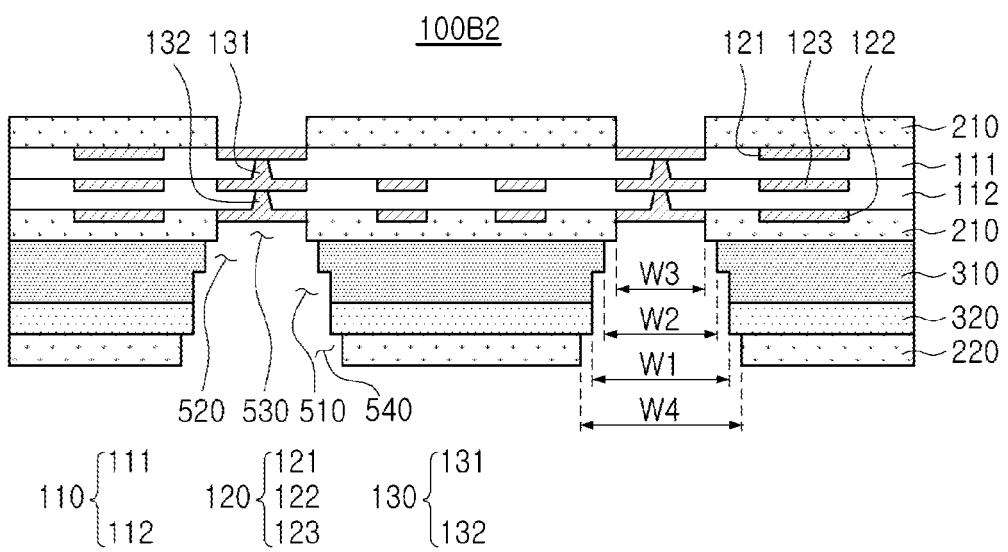
FIG. 8 is a cross-sectional view schematically illustrating a modified example of the printed circuit board of FIG. 7.

FIG. 8 is a cross-sectional view schematically illustrating a modified example of the printed circuit board of FIG. 7.

Referring to FIG. 8, in a printed circuit board 100B2 according to the modified example, as compared to the printed circuit board 100B1 according to the other example described above, a second passivation layer 220 may be further disposed on a second reinforcing layer 320. In this case, a plurality of fourth openings 540 having a fourth width W4 may be formed in the second passivation layer 220.

Specifically, a second passivation layer 220 having a fourth opening 540 having a fourth width W4 may be disposed on the second reinforcing layer 320, and the fourth opening 540 may be formed to overlap each of the first to third openings 510, 520, and 530 when viewed from a stacking direction.

With respect to the second passivation layer 220, the fourth opening 540, and the fourth width W4, the same description as described above may be applied as it is.

With respect to the description of other overlapping components, the description of the printed circuit board 100B1 according to another example may be equally applied, and thus the description thereof will be omitted.

Figure 9:
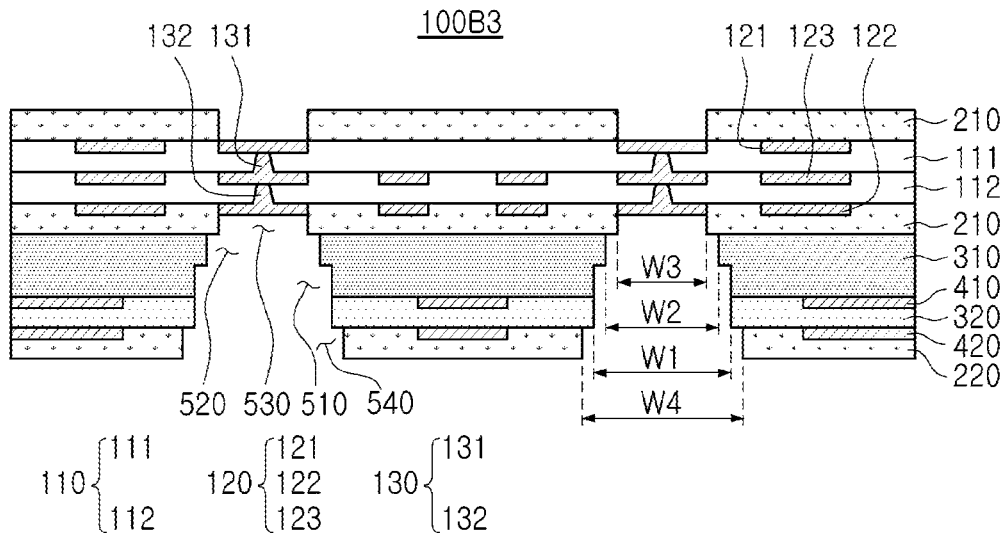
FIG. 9 is a cross-sectional view schematically illustrating another modified example of the printed circuit board of FIG. 7.

FIG. 9 is a cross-sectional view schematically illustrating another modified example of the printed circuit board of FIG. 7.

Referring to FIG. 9, in a printed circuit board 100B3 according to another modified example, as compared to the printed circuit board 100B2 according to the above-described modified example, a plurality of first and second metal layers 410 and 420 may be disposed on first and second reinforcing layers 310 and 320, respectively. In this case, the first metal layer 410 may be covered by a second reinforcing layer 320, and the second metal layer 420 may be covered by a second passivation layer 220.

The first and second metal layers 410 and 420 may perform a function of additionally reinforcing the rigidity of the printed circuit board 100B3, respectively, and may additionally be connected to a ground to perform an EMI shielding function.

With respect to the materials and properties of the first and second metal layers 410 and 420, the description of the metal layer 400 in the printed circuit board 100A3 according to the other modification described above may be equally applied.

With respect to the description of other overlapping components, the description of the printed circuit board 100B2 according to the modified example may be equally applied, and thus the description thereof will be omitted.

Figure 10:
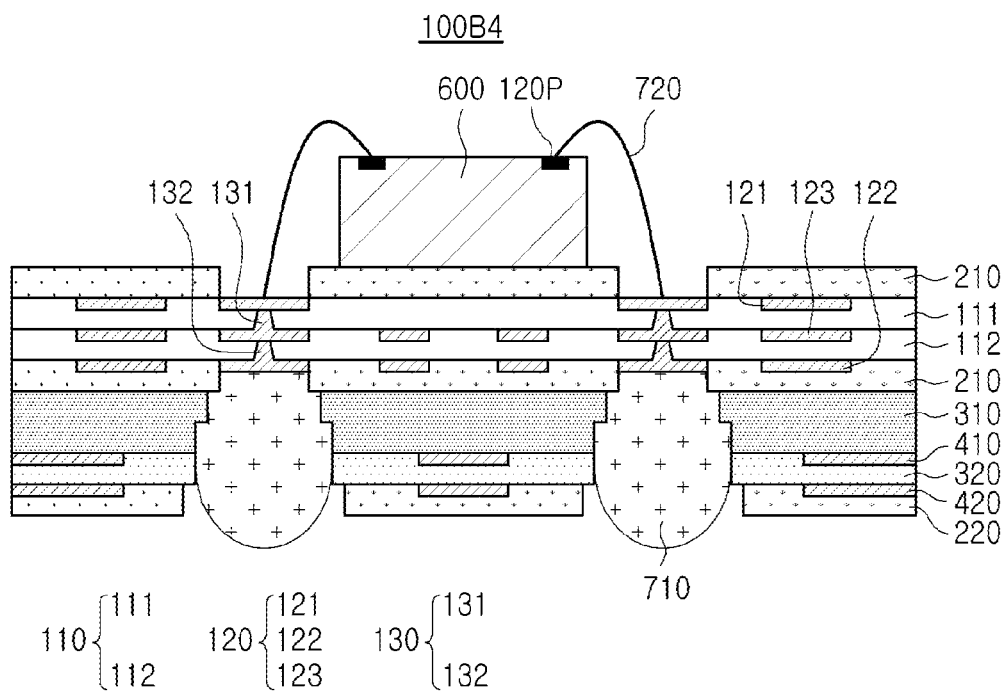
FIG. 10 is a cross-sectional view schematically illustrating another modified example of the printed circuit board of FIG. 7.

FIG. 10 is a cross-sectional view schematically illustrating another modified example of the printed circuit board of FIG. 7.

Referring to FIG. 10, in a printed circuit board 100B4 according to another modified example, as compared to the printed circuit board 100B3 according to the other modified example described above, an electronic component 600, and first and second electrical connection metals 710 and 720 are further disposed.

With respect to the electronic component 600 and the first and second electrical connection metals 710 and 720, the description of the printed circuit board 100A4 according to the other modified example described above may be equally applied, and thus detailed description thereof is omitted.

With respect to the description of other overlapping components, the description of the printed circuit board 100B3 according to the above-described other modified example may be equally applied, and thus the description thereof will be omitted.

FIGS. 11 to 17 are cross-sectional views schematically illustrating an example of manufacturing the printed circuit board of FIG. 3.

Figure 11:
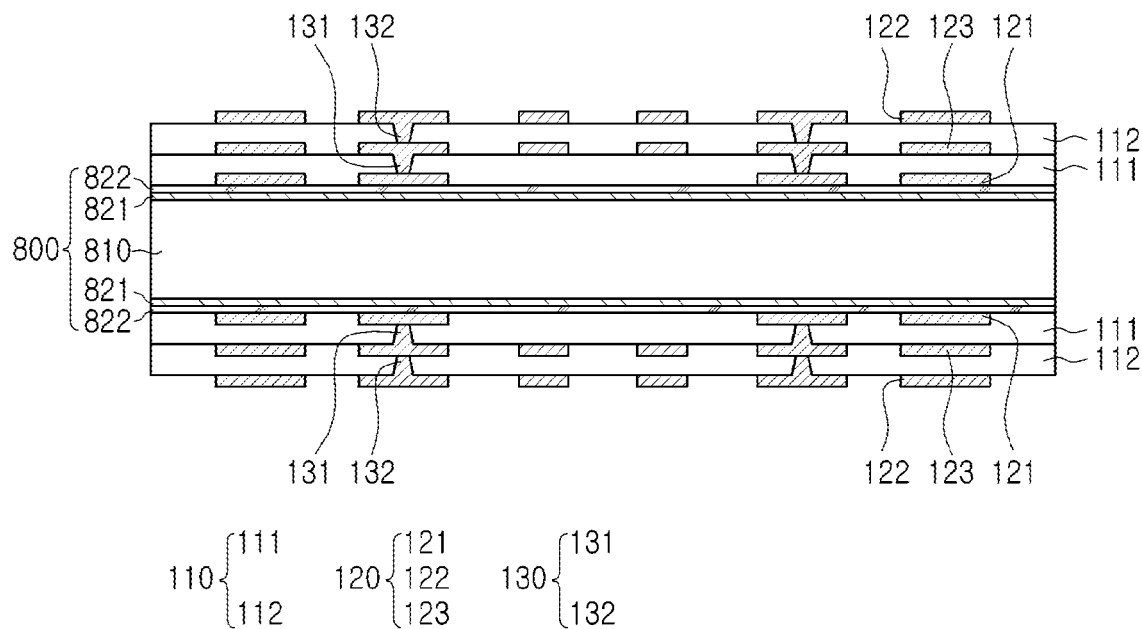
FIGS. 11 to 17 are cross-sectional views schematically illustrating an example of manufacturing the printed circuit board of FIG. 3.
Figure 12:
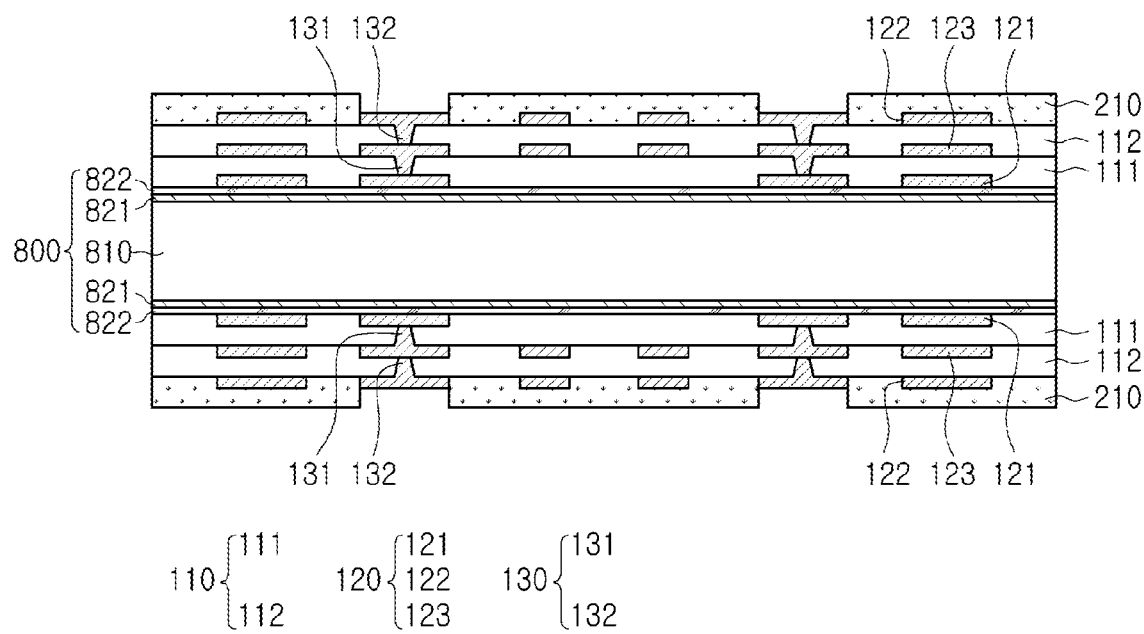

Referring to FIGS. 11 and 12, first, a carrier 800 in which metal foils 821 and 822 are disposed on at least one surface is prepared. Thereafter, a first circuit layer 121 is formed on the metal foils 821 and 822 by a plating process. Next, a first insulating layer 111 for filling the first circuit layer 121 is formed on the first circuit layer 121, and a via hole is processed in the first insulating layer 111 using a laser drill, or the like, and then a first via hole 131 and an internal circuit layer 123 are formed by a plating process. Next, a second insulating layer 112 embedding the internal circuit layer 123 is formed, a via hole is processed in the second insulating layer 112 using a laser drill, or the like, and then a second via layer 132 and a second circuit layer 122 are formed through a plating process. Next, a first passivation layer 210 having a fourth opening 540 exposing at least a portion of the second circuit layer 122 is formed.

Figure 13:
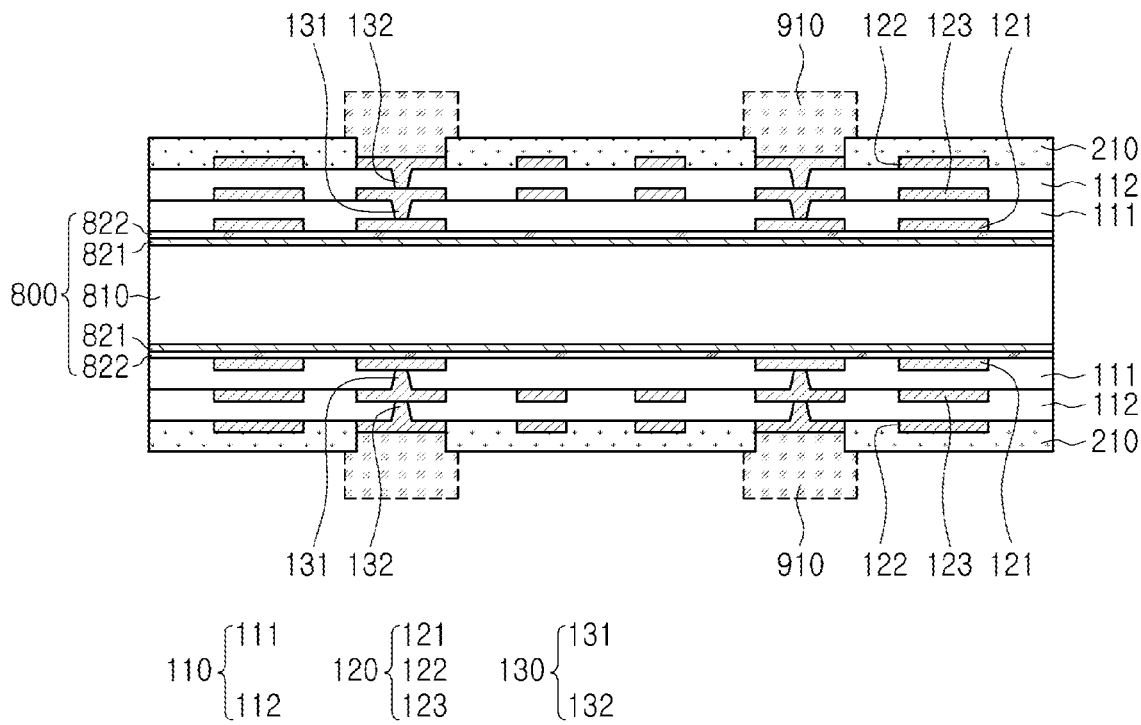

Referring to FIG. 13, a first passivation layer 910 covering the second circuit layer 122 exposed from the first passivation layer 210 is formed on the first passivation layer 210.

The first protective layer 910 may serve to protect the second circuit layer 122 during a blast process to be described later, and may have a second width W2, which is the same as that of the second opening 520 to be formed later. The first protective layer 910 may be used without limitation as long as it includes a material that is less affected during the blasting process. For example, a known dry film resist may be used, and may also include a resin that can be melted through a chemical treatment. Alternatively, it may include a metal material as necessary.

Figure 14:
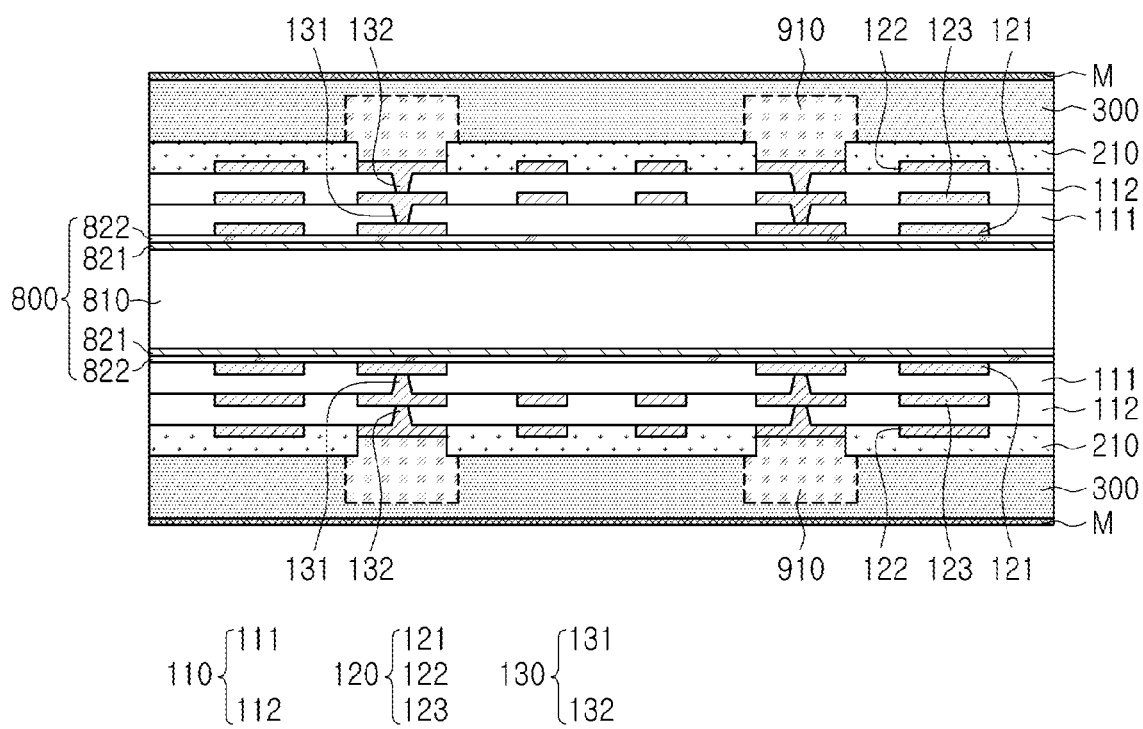

Referring to FIG. 14, a reinforcing layer 300 filling the first passivation layer 910 may be formed on the first passivation layer 210. When the reinforcing layer 300 is provided in a form of an RCC, a copper foil M may be additionally disposed. The reinforcing layer 300 may not include a reinforcing material such as glass fiber, since a portion thereof is removed by a blasting process to be described later.

Figure 15:
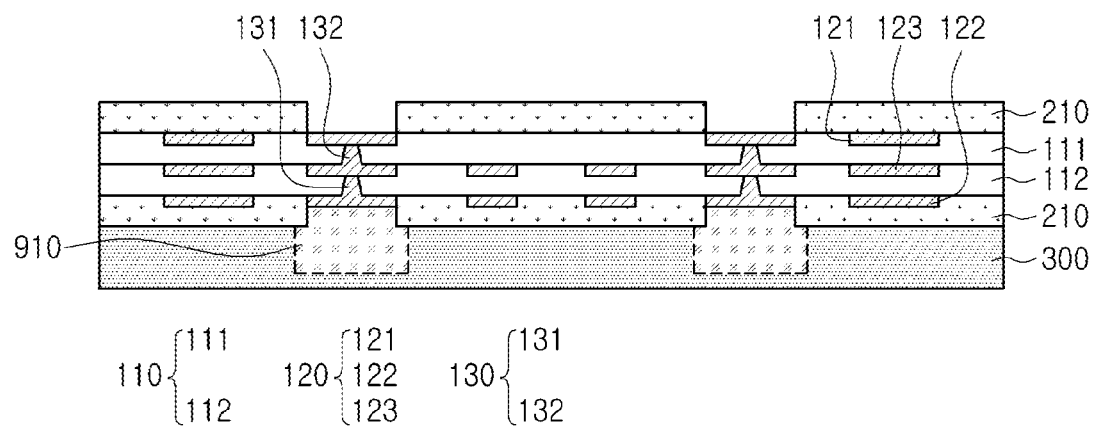

Referring to FIG. 15, after each of laminates on both surfaces of a carrier 800 is separated, a first passivation layer 210 having an opening may be disposed on the other side of the plurality of insulating layers 110. The first passivation layer 210 disposed on the other side of the plurality of insulating layers 110 may expose an upper surface of the first circuit layer 121 embedded in the first insulating layer 111 externally.

In addition, when the reinforcing layer 300 is provided in a form of an RCC, a copper foil M may be etched and removed. However, the copper foil M does not necessarily have to be completely removed, and the copper foil M may be patterned and removed only in partial regions, and may remain in remaining regions, and the copper foil in the remaining regions may reinforce rigidity of the printed circuit board, as shown in FIG. 5 to be described later.

Figure 16:
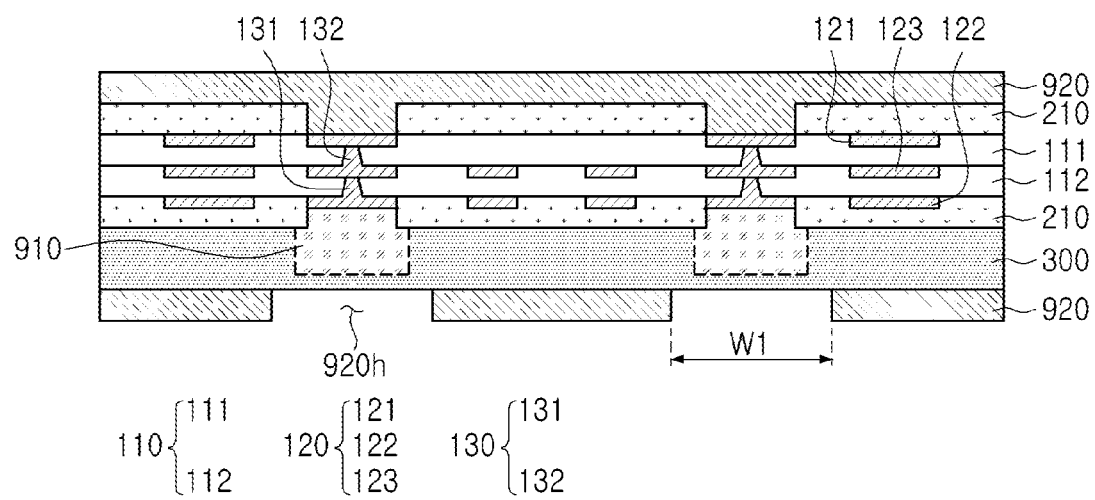

Referring to FIG. 16, a second protective layer 920 may be stacked on both surfaces of the laminate. Since the second protective layer 920 may function as a mask for a blast process, it may include a material that is less affected by the blast process. In this case, a portion of the second passivation layer 920, in contact with the reinforcing layer 300, among the second passivation layers 920 may be selectively removed. An opening 920h may exist in the region from which the second passivation layer 920 is selectively removed, and the second passivation layers 920 may be spaced apart from each other by a width of the opening 920h. The width of the opening 920h may be substantially the same as the first width W1, which is a width of the first opening 510 to later be formed in the reinforcing layer 300. In addition, when viewed in a stacking direction, a cross-section of the opening 920h may be substantially the same as a cross-section of the first opening 510 formed in the reinforcing layer 300 formed later.

Figure 17:
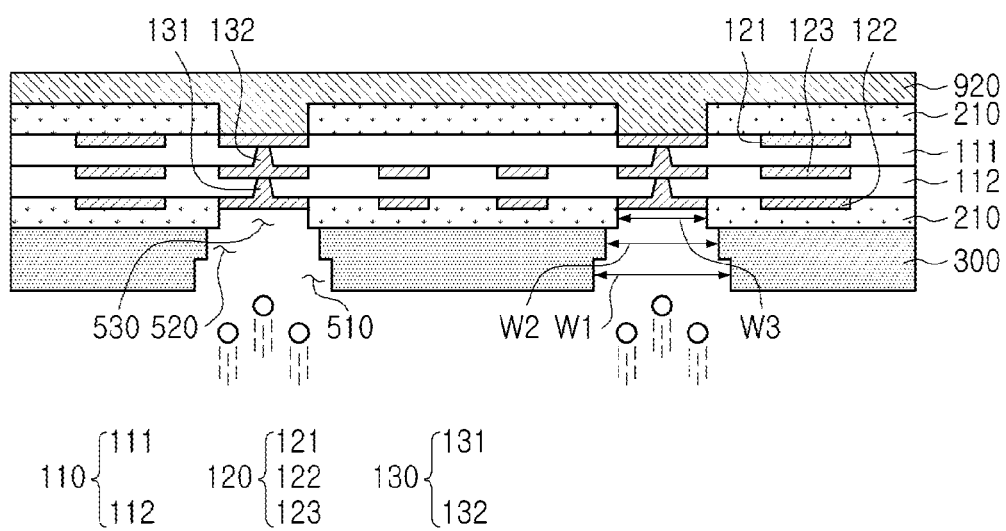

FIG. 17 shows a result of the blasting process using the second protective layer 920 as a mask, which is a structure of the printed circuit board 100A1 according to an example of the present disclosure of FIG. 3. After a first opening 510 is formed in the reinforcing layer 300 through a blast process using the second protective layer 920 as a mask, the first protective layer 910 may be removed such that a second opening 520 may be formed. When the first protective layer 910 includes a photosensitive material such as a dry film, it may be removed through an exposure/development process, but is not limited thereto. That is, when the first protective layer 910 includes a resin that reacts with a specific chemical, the first protective layer 910 may be removed by chemical treatment without the exposure/development process. Alternatively, when the first passivation layer 910 includes a metal material, the first passivation layer 910 may also be removed by etching using an etchant reacting with the first passivation layer 910. In this case, a surface treatment layer described above may be disposed on a second circuit layer 122, and only the first protective layer 910 may be removed without damages to the second circuit layer 122 due to the protection of the surface treatment layer.

As described above, when a blasting process is performed on the reinforcing layer 300 in a state in which the first protective layer 910 is present, as compared to a case in which the blast process directly affects a circuit layer, for example, a second circuit layer 122, damages to the second circuit layer 122 can be prevented, and the thickness of the second circuit layer 122 may be reduced such that it is to prevent signal transmission failure from occurring.

As used herein, the terms "side portion," "side surface," and the like, are used to refer to a direction toward a first or second direction or a surface on said direction. The terms "upper side," "upper portion", "upper surface," and the like, are used to refer to a direction toward a third direction or a surface on said direction, while the terms "lower side," "lower portion," "lower surface," and the like, are used to refer to a direction opposing the direction toward the third direction or a surface on said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of right of the exemplary embodiments is not particularly limited to the above terms.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and do not necessarily refer to the same embodiment. Furthermore, the particular characteristics or features may be combined in any suitable manner in one or more embodiments. For example, a context described in a specific exemplary embodiment maybe used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

As set forth above, as one of the various effects of the present disclosure, it is possible to provide a printed circuit board with reinforced rigidity.

As another one of the various effects of the present disclosure, it is possible to provide a printed circuit board including a reinforcing layer in which a plurality of openings having different widths are formed.

As another one of several effects of the present disclosure, a printed circuit board in which a plurality of reinforcing layers are stacked may be provided.

While exemplary embodiments have been shown and described above, it will be apparent to those skilled in the art that modifications and variations could be made without departing from the scope of the present invention as defined by the appended claims.

What is claimed is:

1. A printed circuit board, comprising:
a plurality of insulating layers;
a plurality of circuit layers disposed on at least one of an interior and an exterior of the plurality of insulating layers;
a reinforcing layer disposed on one surface of the plurality of insulating layers, and having a first opening having a first width and a second opening having a second width, different from the first width; and
first passivation layers respectively disposed on one surface and the other surface of the plurality of insulating layers,
wherein the reinforcing layer is disposed on one of the first passivation layers,
wherein the first and second openings are devoid of any circuit layer, and
wherein an inner wall of the reinforcing layer, provided by the first and second openings, has a step portion.

2. The printed circuit board of claim 1, wherein at least one of the plurality of insulating layers comprises an insulating resin and a reinforcing material,
wherein the reinforcing layer does not include the reinforcing material.

3. The printed circuit board of claim 1, wherein the first and second openings include at least some regions thereof which overlap in a stacking direction of the plurality of insulating layers.

4. The printed circuit board of claim 3, wherein the first width is greater than the second width.

5. The printed circuit board of claim 1, wherein the one of the first passivation layers comprises a third opening having a third width,
wherein the third width is different from the first and second widths.

6. The printed circuit board of claim 5, wherein at least a portion of the third opening overlaps the first and second openings in a stacking direction of the plurality of insulating layers,
wherein the third width is smaller than the second width.

7. The printed circuit board of claim 6, further comprising:
a second passivation layer disposed on the reinforcing layer.

8. The printed circuit board of claim 7, further comprising:
a metal layer disposed on the reinforcing layer.

9. The printed circuit board of claim 8, wherein the second passivation layer comprises a fourth opening having a fourth width,
wherein at least a portion of the fourth opening overlaps each of the first to third openings in the stacking direction,
wherein the fourth width is greater than the first to third widths.

10. The printed circuit board of claim 1, wherein the plurality of circuit layers comprise:
a first circuit layer embedded from the other surface of the plurality of insulating layers; and
a second circuit layer protruding from one surface of the plurality of insulating layers.

11. The printed circuit board of claim 10, further comprising:
a first electrical connection metal disposed in the first and second openings, and in contact with the second circuit layer;
an electronic component disposed on the other surface of the plurality of insulating layers; and
a second electrical connection metal connecting the electronic component and the second circuit layer.

12. A printed circuit board, comprising:
a plurality of insulating layers;
a plurality of circuit layers disposed on at least one of an interior and an exterior of the plurality of insulating layers;
a first reinforcing layer disposed on one surface of the plurality of insulating layers in a stacking direction of the plurality of insulating layers;
a second reinforcing layer disposed on a surface of the first reinforcing layer, opposite to another surface of the first reinforcing layer closer to the plurality of insulating layers than the surface of the first reinforcing layer in the stacking direction;
a first opening having a first width passing through at least a portion of the first and second reinforcing layers, respectively;
a second opening having a second width, different from the first width, and passing through at least a portion of the first reinforcing layer; and
first passivation layers respectively disposed on one surface and the other surface of the plurality of insulating layers,
wherein the first reinforcing layer is disposed on one of the first passivation layers,
wherein the first and second openings are devoid of any circuit layer.

13. The printed circuit board of claim 12, wherein at least a portion of the plurality of circuit layers protrude from one surface of the plurality of insulating layers, and
at least the other portion of the plurality of circuit layers are embedded from the other surface of the plurality of insulating layers.

14. The printed circuit board of claim 12, wherein the first width is greater than the second width,
wherein the first and second openings are connected in the first reinforcing layer.

15. The printed circuit board of claim 12, wherein an inner wall of the first opening and an inner wall of the second opening have a step portion.

16. The printed circuit board of claim 12, further comprising:
an electrical connection metal disposed in the first and second openings to be in contact with a portion of the plurality of circuit layers.

17. The printed circuit board of claim 16, wherein the portion of the plurality of circuit layers protrudes from one of the plurality of insulating layers toward the electrical connection metal.

* * * * *